US012593419B2

(12) United States Patent
Wu et al.

(10) Patent No.: US 12,593,419 B2
(45) Date of Patent: Mar. 31, 2026

(54) CONNECTOR FOR ACCOMMODATING THE ACCUMULATED TOLERANCE, SERVER, AND COMPUTER

(71) Applicant: Fulian Precision Electronics (Tianjin) Co., LTD., Tianjin (CN)

(72) Inventors: Chang-Ju Wu, New Taipei (TW); Chih-Min Lin, New Taipei (TW)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 286 days.

(21) Appl. No.: 18/512,927

(22) Filed: Nov. 17, 2023

(65) Prior Publication Data

US 2024/0414870 A1     Dec. 12, 2024

(30) Foreign Application Priority Data

Jun. 6, 2023     (CN) .......................... 202310665763.7

(51) Int. Cl.
 *H05K 7/14*       (2006.01)
 *F16L 21/00*       (2006.01)
 *H01R 13/631*       (2006.01)
(52) U.S. Cl.
 CPC ............ *H05K 7/1488* (2013.01); *F16L 21/00* (2013.01); *H01R 13/631* (2013.01)
(58) Field of Classification Search
 None
 See application file for complete search history.

(56) References Cited

U.S. PATENT DOCUMENTS

| | | | | |
|---|---|---|---|---|
| 5,383,790 A | * | 1/1995 | Kerek | .................. H01R 13/635 |
| | | | | 439/248 |
| 6,517,530 B1 | * | 2/2003 | Kleven | ................ A61B 1/0052 |
| | | | | 606/1 |
| 8,029,324 B1 | * | 10/2011 | Yi | ........................ H01R 13/518 |
| | | | | 439/745 |
| 9,130,328 B1 | * | 9/2015 | Huang | ............... H01R 13/2421 |
| 10,498,061 B1 | * | 12/2019 | Blasick | .................. H01R 24/50 |
| 2010/0027382 A1 | * | 2/2010 | Daout | .................... G04B 17/20 |
| | | | | 368/175 |

(Continued)

FOREIGN PATENT DOCUMENTS

| | | |
|---|---|---|
| CN | 111403958 | 7/2020 |
| TW | M634393 | 11/2022 |

*Primary Examiner* — James Wu
*Assistant Examiner* — Christopher L Augustin
(74) *Attorney, Agent, or Firm* — ScienBiziP, P.C.

(57) ABSTRACT

A connector for connecting to a first connecting member comprises a first supporting member, a second supporting member and an elastic member. A mounting hole is defined on the first supporting member for movable connecting to the first supporting member. The second supporting member is configured to be able to deflect axially relative to the first supporting member. The elastic member comprises a first ring body and a second ring body. A gap is defined between the first ring body and the second ring body for translating or deflecting the first ring body relative to the second ring body. When the second supporting member moves and/or deflects relative to the first supporting member, the first ring body and the second ring body are forced to translate and/or deflect relative to each other. The connector is applied in the server and computer for accommodating the accumulated tolerance.

5 Claims, 11 Drawing Sheets

200

(56)                    References Cited

U.S. PATENT DOCUMENTS

| | | | | |
|---|---|---|---|---|
| 2012/0082010 A1* | 4/2012 | Boulenguiez | ........ | G04B 17/325 |
| | | | | 368/184 |
| 2015/0071730 A1* | 3/2015 | Tseng | .................. | F16B 5/0208 |
| | | | | 411/318 |
| 2019/0045652 A1* | 2/2019 | Hirano | ................ | H05K 7/1492 |
| 2023/0143344 A1* | 5/2023 | Marquis | ................ | F16L 37/52 |
| | | | | 285/261 |

* cited by examiner

100

200

200

200

200

P1

22

23

21

112

Y

X — X

Y

200

200

200

<u>23</u>

CONNECTOR FOR ACCOMMODATING THE ACCUMULATED TOLERANCE, SERVER, AND COMPUTER

CROSS-REFERENCE TO RELATED APPLICATIONS

This application claims priority to Chinese Patent Application No. 202310665763.7 filed on Jun. 6, 2023, filed in China National Intellectual Property Administration, the contents of which are incorporated by reference herein.

FIELD

The subject matter herein generally relates to computer devices, and more particularly to a connector for accommodating the accumulated tolerance and a server.

BACKGROUND

When assembling electrical connectors, liquid cooling connectors (or air cooling connectors), a male connector need to be joined with a female connector. Precise alignment is crucial to ensure a reliable connection between the male connector and the female connector. The server includes a first connector, the computer includes a rack and a second connector located in the rack, and the server is mounted on the rack. In practice, the first connector and the second connector may not be easily aligned and connected, because the accumulated tolerance of the rack and the server.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

Figure 1:
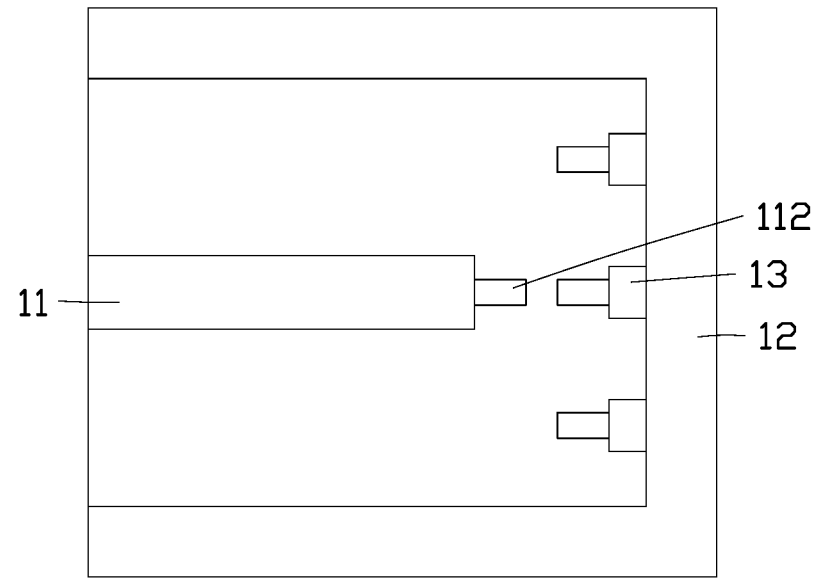
FIG. 1 is a sketch of a computer in an embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

The present disclosure, including the accompanying drawings, is illustrated by way of examples and not by way of limitation. Several definitions that apply throughout this disclosure will now be presented. It should be noted that references to "an" or "one" embodiment in this disclosure are not necessarily to the same embodiment, and such references mean "at least one."

The connection can be such that the objects are permanently connected or releasably connected. The term "comprising" means "including, but not necessarily limited to".

Without a given definition otherwise, all terms used have the same meaning as commonly understood by those skilled in the art. The terms used herein in the description of the present disclosure are for the purpose of describing specific embodiments only, and are not intended to limit the present disclosure.

As shown in FIG. 1, a computer 100 of an embodiment includes a server 11 and a rack 12, the server 11 is connected to the rack 12.

Figure 2:
FIG. 2 is an isometric, assembled view of a connector in an embodiment of the present disclosure.
Figure 2:
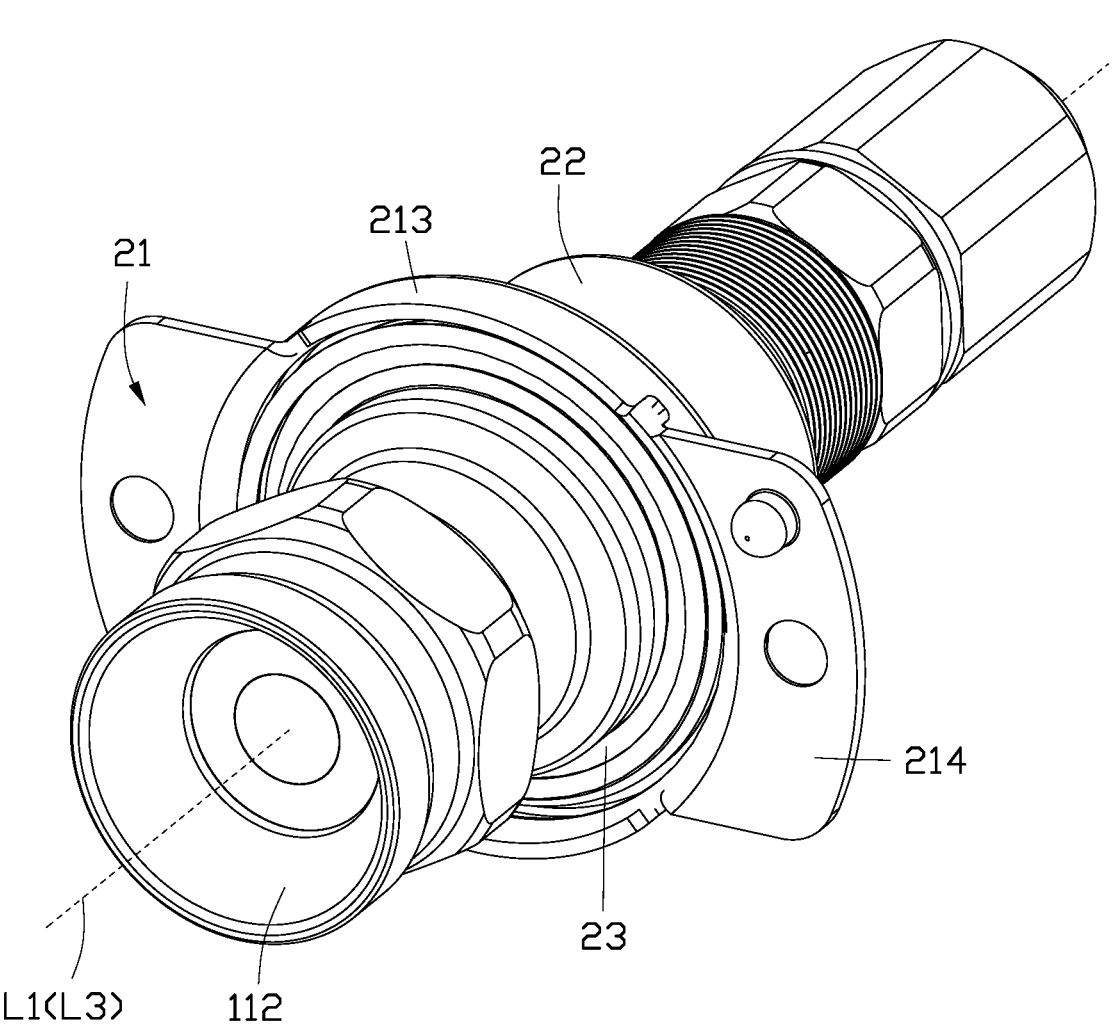

As shown in FIGS. 1 and 2, the server 11 includes a chassis 111, a first connecting member 112, and a connector 200. The connector 200 is disposed in the chassis 111, and the first connecting member 112 is disposed in the connector 200. The computer 100 also includes a second connecting member 13. The second connecting member 13 is disposed in the rack 12 and connected to the first connecting member 112. When the server 11 is connected to the rack 12, the first connecting member 112 is able to adjust its position and angle through the connector 200, so that the first connecting member 112 and the second connecting member 13 can be precisely aligned.

Figure 3:
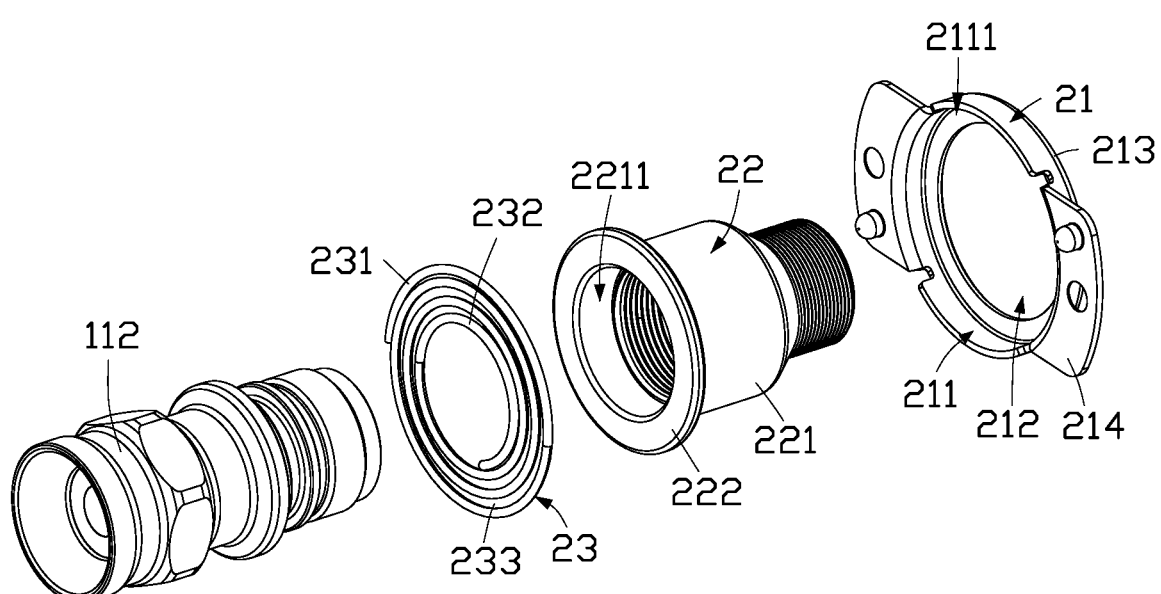
FIG. 3 is exploded view of the connector in FIG. 2.

As shown in FIGS. 2 and 3, in some embodiments, the connector 200 includes a first supporting member 21, a second supporting member 22, and an elastic member 23. The first supporting member 21 has a mounting hole 211. The second supporting member 22 is at least partially movably disposed in the mounting hole 211. The second supporting member 22 is configured for mounting the first connecting member 112. The elastic member 23 is at least partially disposed in the mounting hole 211, and the elastic member 23 is configured to drive the first connecting member 112 or the second connecting member 13, and reset the relative positions of the first connecting member 112 and the second supporting member 22.

As shown in FIGS. 2 and 3, in some embodiments, the mounting hole 211 has a bottom wall 2111. A floating hole 212 is defined on the first supporting member 21, and located on the bottom wall 2111. One end of the second supporting member 22 is acted on the bottom wall 2111, and the other end extends into the floating hole 212. The second supporting member 22 is movably mounted in the floating hole 212.

As shown in FIGS. 2 and 3, in some embodiments, the first supporting member 21 includes a body portion 213 and a support portion 214. The mounting hole 211 is disposed in the body portion 213. The support portion 214 is disposed in the body portion 213 and is located on the outside of the mounting hole 211. The support portion 214 is configured to cooperate with the chassis 111 to form a mounting cavity. When assembling the connector 200 with the chassis 111 of the server 11, the support portion 214 acts on a wall surface of the chassis 111, so that an inner wall of the mounting hole 211 and the wall surface of the chassis 111 together enclose to form the mounting cavity. The bottom wall 2111 of the mounting hole 211 is opposite to the wall surface of the chassis 111 to restrict the movement of the elastic member 23 and the portion of the second supporting member 22 disposed in the mounting hole 211 along the first supporting member 21. The stability of the mounting of the elastic member 23 and the second supporting member 22 are also improved.

As shown in FIGS. 2 and 3, in some embodiments, the second supporting member 22 includes a floating part 221 and a limiting part 222. The floating part 221 is connected to the limiting part 222. The floating part 221 is disposed through a floating hole 212. A mounting hole 2211 is defined on the floating part 221. The first connecting member 112 is mounted in the mounting hole 2211. The limiting part 222 is in an annular-shape and is disposed around the outer periphery of the floating part 221, and the limiting part 222 acts on the bottom wall 211 of the mounting hole 211.

In some embodiments, the limiting part 222 is disposed in the mounting cavity to restrict movement of the second supporting member 22 along the axial direction of the first supporting member 21.

As shown in FIGS. 1 to 3, the axis of the first connecting member 112 is defined as a first axis L1, and the axial direction of the first connecting member 112 is parallel to the first axis L1. When the first connecting member 112 is connected to the second connecting member 13, the second connecting member 13 pushes the first connecting member 112 in the direction of the first axis L1. The first connecting member 112 drives the second supporting member 22 to move in the direction of the first axis L1. The restriction portion 222 acts on the bottom wall 2111 of the mounting hole 211, for preventing the second supporting member 22 from moving in the direction of the first axis L1. The first connecting member 112 and the second connecting member 13 can be connected along the direction of the first axis L1. In some other embodiments, the second supporting member 22 is driven by an external force, and the second supporting member 22 drives the first connecting member 112 to be aligned with the second connecting member 13, so as to enable the first connecting member 112 to be connected to the second connecting member 13 in the direction of the first axis L1.

Figure 4:
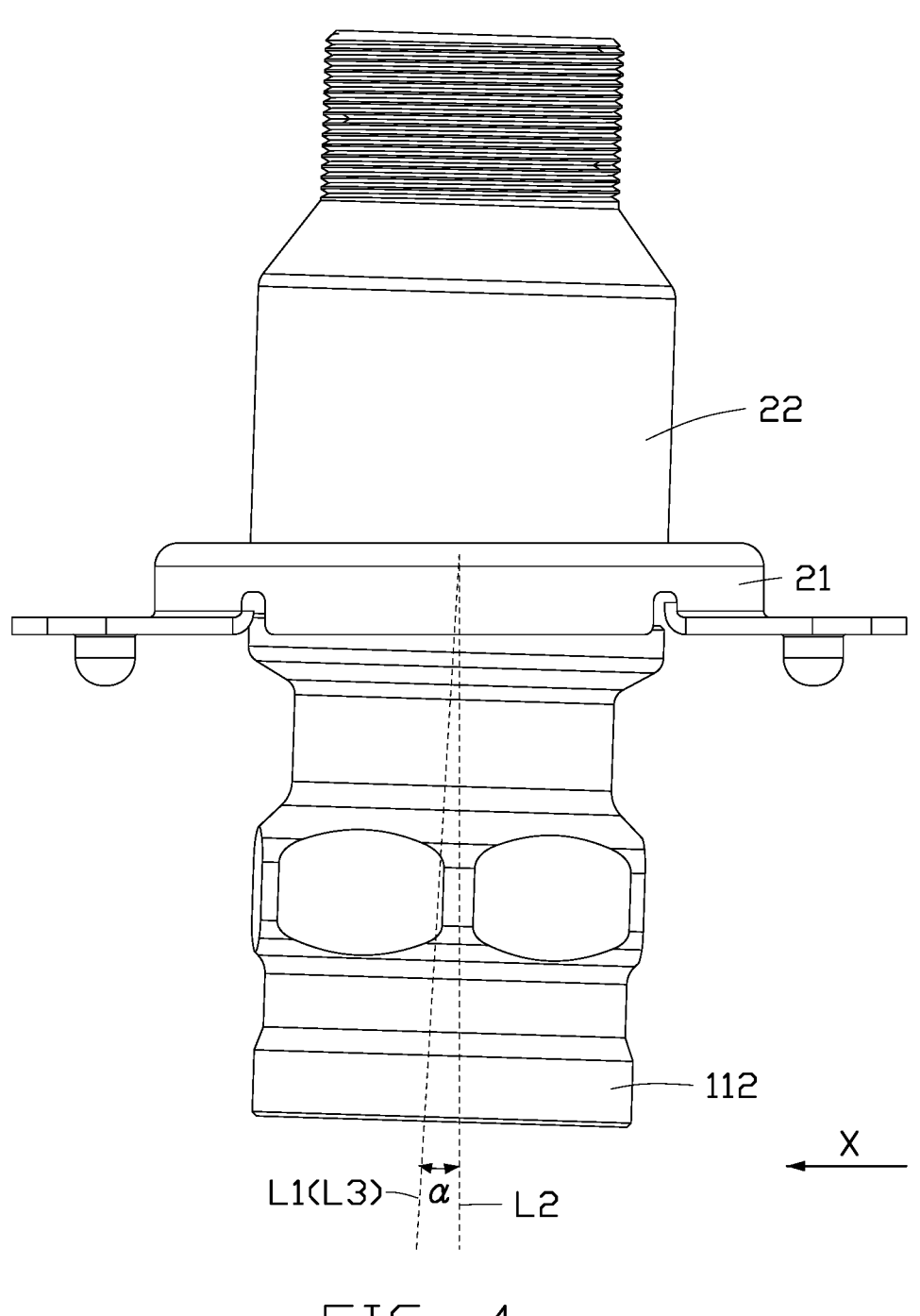
FIG. 4 is another isometric, assembled view of the connector in FIG. 2, wherein a second supporting member is deflected.

As shown in FIGS. 2 and 4, FIG. 2 shows a state of the connector 200 when the second supporting member 22 is not deflected or moved, and FIG. 4 shows a state of the connector 200 when the second supporting member 22 is deflected. In some embodiments, the second supporting member 22 is configured to be able to be deflected relative to the axial direction of the first supporting member 21 when subjected to a force so as to form an angle between the axial direction of the second supporting member 22 and the axial direction of the first supporting member 21. The second supporting member 22 is configured to be able to move in a direction perpendicular to the axial direction of the first supporting member 21 when subjected to a force. The second supporting member 22 is able to move or deflect relative to the first supporting member 21 to drive the first connecting member 112 to move or deflect with respect to the axial direction of the first supporting member 21. The angular tolerance and the positional tolerance between the first connecting member 112 and the second connecting member 13 can be minimized for connecting the first connecting member 112 and the second connecting member 13.

As shown in FIGS. 2 and 4, in some embodiments, the second supporting member 22 is able to be deflected relative to the first supporting member 21 for enabling the first connecting member 112 to be deflected relative to the first supporting member 21. The axis of the first supporting member 21 is defined as a second axis L2. The axis of the second supporting member 22 is defined as a third axis L3. The first axis L1 is parallel to the third axis L3. When the first connecting member 112 is deflected in the axial direction with respect to the first supporting member 21, a first angle $\alpha$ is formed between the first axis L1 and the second axis L2. When the first connecting member 112 is difficult to be aligned with the second connecting member 13 due to an angular tolerance, the second supporting member 22 is able to be deflected relative to the first supporting member 21, such that the first connecting member 112 is able to be deflected to a position for aligning with the second connecting member 13.

As shown in FIGS. 2 and 4, in some embodiments, the second supporting member 22 is able to be deflected relative to the first supporting member 21 at an angle in a range of greater than 0 degrees and less than or equal to 6.0 degrees, i.e., the first angle $\alpha$ is in a range of greater than 0 degrees and less than or equal to 6.0 degrees, which not only facilitates overcoming angular tolerance to realize docking of the first connecting member 112 and the second connecting member 13, but also enables the first connecting member 112 not to be easily shaken, thereby facilitating docking with the second connecting member 13. not be easily shaken, thereby facilitating stable connection with the second connecting member 13.

As shown in FIGS. 2 and 4, in one embodiment, the second supporting member 22 is able to be deflected in any direction perpendicular to the second axis L2, for example, the second supporting member 22 is deflected in a first direction X by 5.9 degrees, or the second supporting member 22 is deflected in a second direction Y by 5.9 degrees. The first direction X is perpendicular to the second direction Y, and the first direction X is perpendicular to the direction in which the second axis L2 is located, and the second direction Y is perpendicular to the direction in which the second axis L2 is located. The actual deflection angle of the second supporting member 22 is based on an angular tolerance between the first connecting member 112 and the second connecting member 13.

In some other embodiments, the first angle $\alpha$ may also be 0.5 degrees, 1.6 degrees, 3.6 degrees, 4.9 degrees, 5.0 degrees or 5.5 degrees.

In some other embodiments, the first direction X and the second direction Y may also be non-perpendicular, for example, the angle formed between the first direction X and the second direction Y can be 30 degrees, 60 degrees, 90 degrees, 120 degrees, or 150 degrees.

In some embodiments, the second supporting member 22 is able to move axially relative to the first supporting member 21. For example, the second supporting member 22 is able to move in the first direction X or the second direction Y.

Figure 5:
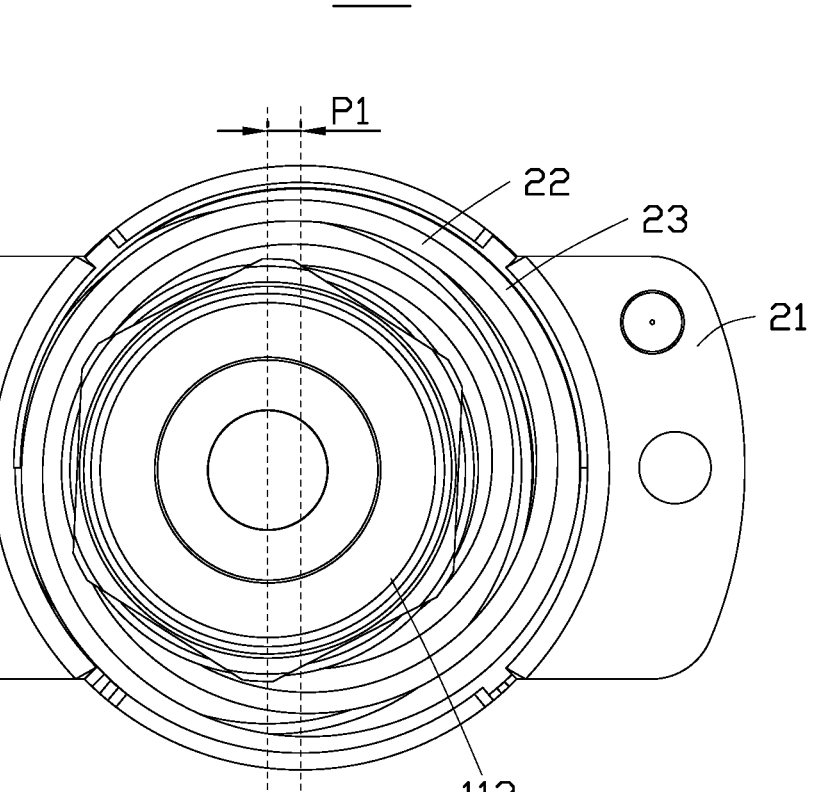
FIG. 5 is another isometric, assembled view of the connector in FIG. 2, wherein the second supporting member is translated.
Figure 5:
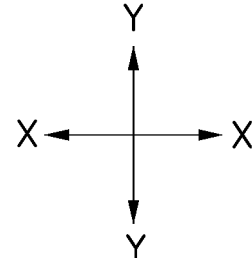
Figure 6:
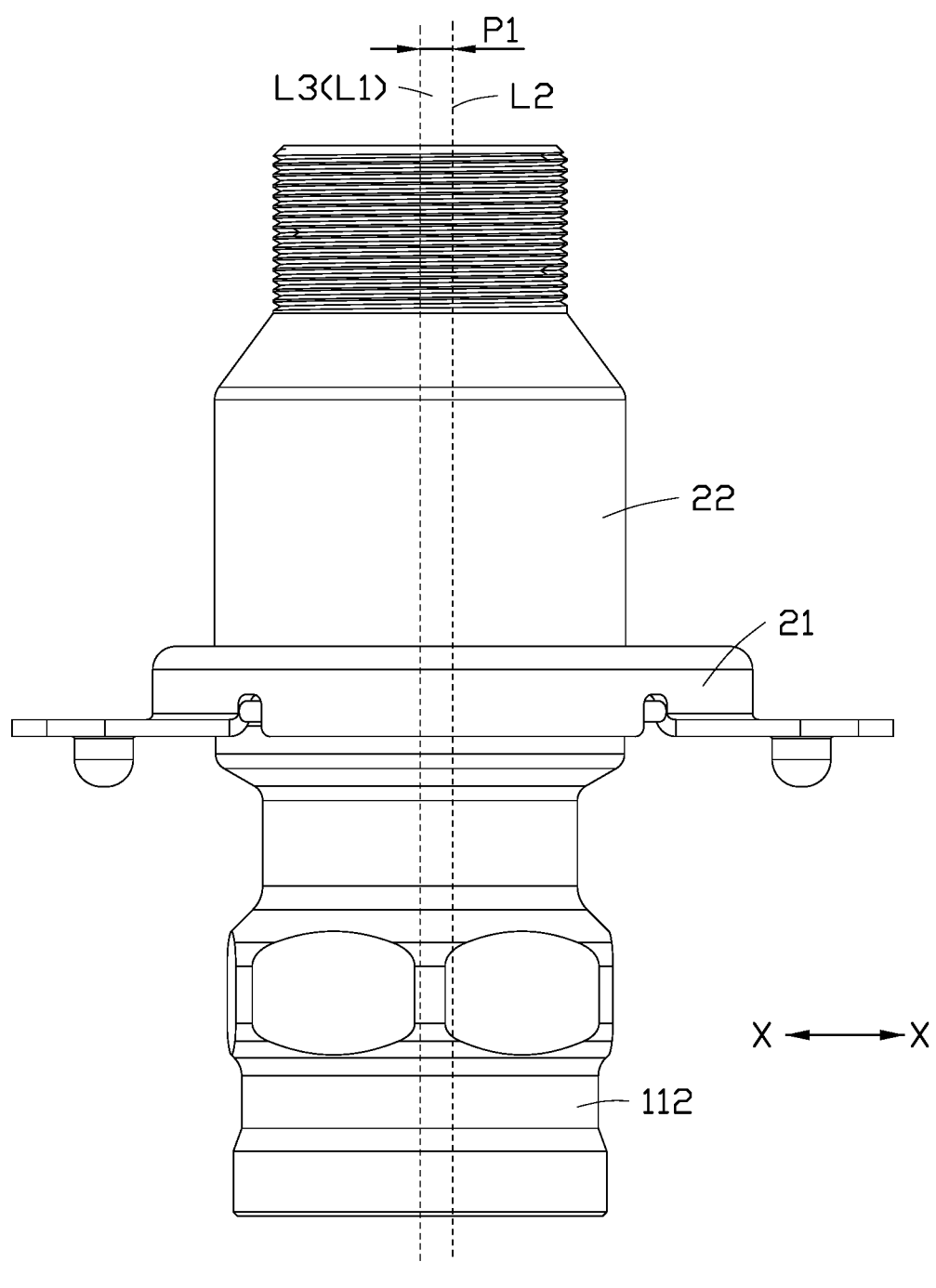
FIG. 6 is another isometric, assembled view of the connector in FIG. 2, wherein the second supporting member is translated.

As shown in FIGS. 5 and 6, in some embodiments, a moving distance of the second supporting member 22 is defined as a first distance P1. The first distance P1 ranges from 0 to 1.1 mm. The first distance P1 refers to the translation distance of the third axis L3 relative to the second axis L2. The second supporting member 22 moves in a direction perpendicular to the second axis L2. The distance that the second supporting member 22 moves toward the first direction X or the second direction Y may be 0.5 mm, 0.8 mm, 1.0 mm or 1.1 mm. For example, when the second supporting member 22 moves in the first direction X, the first distance P1 is 1 mm.

Figure 7:
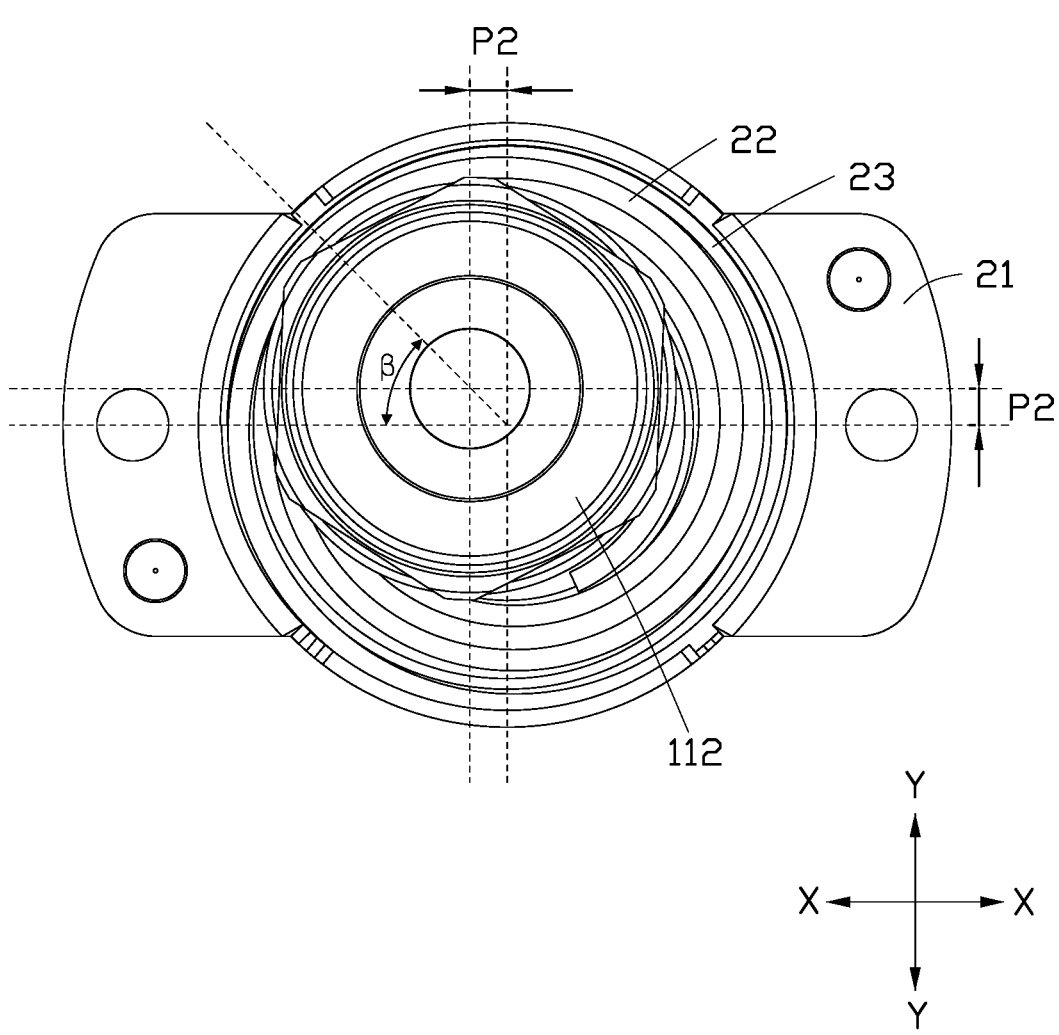
FIG. 7 is another isometric, assembled view of the connector in FIG. 2, wherein the second supporting member is deflected and translated.

As shown in FIG. 7, in some embodiments, the second supporting member 22 is able to have displacements in the first direction X and the second direction Y at the same time. When the second supporting member 22 moves between the first direction X and the second direction Y, a second angle β formed between the moving direction of the second supporting member 22 and the first direction X. The range of the second angle β is greater than 0 degrees and less than 90 degrees.

As shown in FIG. 7, in some embodiments, the second supporting member 22 is able to move and deflect simultaneously relative to the axis of the first supporting member 21. A moving distance that the geometric center of the second supporting member 22 deflected along the first direction X or the second direction Y is defined as a second distance P2. The second distance P2 ranges from 0 to 3 mm. For example, when the second supporting member 22 moves and deflects in the first direction X and the second direction Y at the same time. The first angle α can be 5.9 degrees and the second angle β can be 45 degrees. The second distance P2 2.65 mm which is the distance between the geometric center of the second supporting member 22 and the geometric center of the first supporting member 21.

Figure 8:
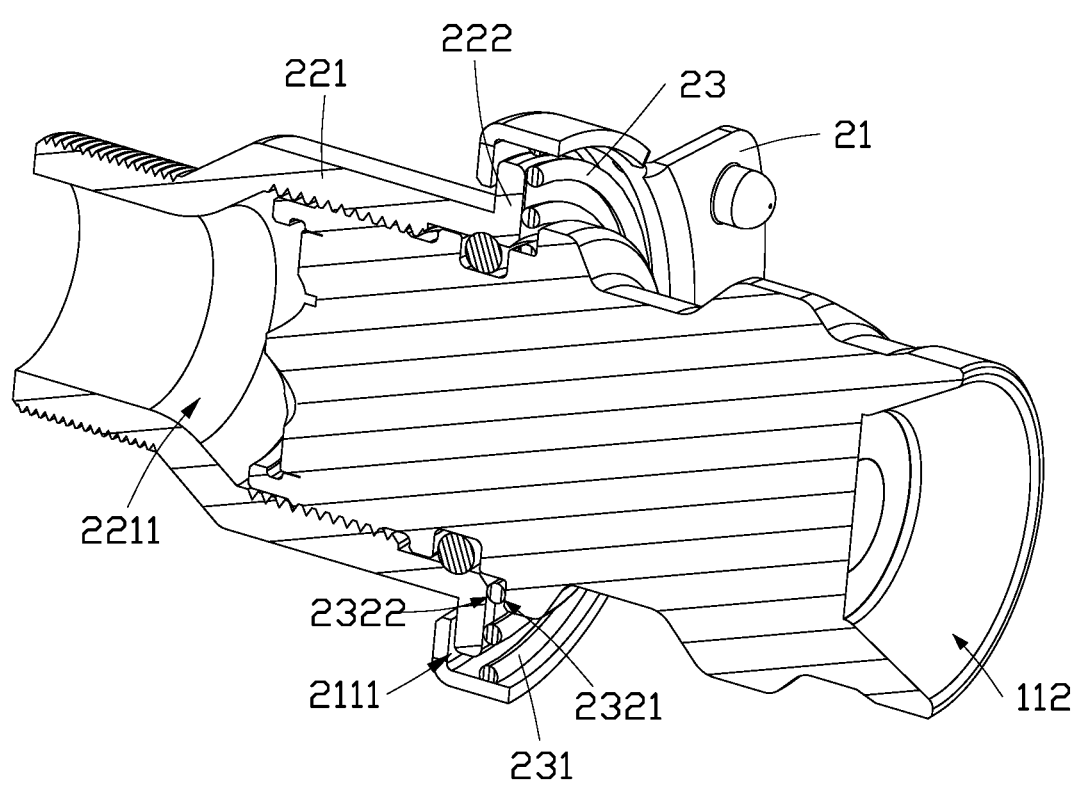
FIG. 8 is a sectional view of the connector in FIG. 2.

As shown in FIGS. 3 and 8, in some embodiments, the elastic member 23 includes a first ring body 231 and a second ring body 232. The first ring body is connected to the second ring body. The first ring body 231 is larger than the second ring body 232 and is surrounded by the second ring body 232. A gap is defined between the first ring body 231 and the second ring body 232, so that the second ring body 232 is able to elastically translate or deflect relative to the first ring body 231. The side of the first ring body 231 away from the first ring body 231 resists an inner wall of the mounting hole 211, and the first ring body 231 is configured to be sleeved on the first connecting member 112. When the second supporting member 22 moves and/or deflects relative to the first supporting member 21, the first ring body 231 is driven to translate and/or deflect relative to and the second ring body 232, and the elastic member 23 acts on the first connecting member 112 for restricting the first connecting member 112 from translating and/or deflecting relative to the second support 22.

When the first connecting member 112 moves and/or deflects relative to the first supporting member 21, the distance between the first connecting member 112 and the inner wall of the mounting hole 211 changes, and the distance between the second supporting member 22 and the inner wall of the mounting hole 211 changes. When the gap between the first ring body 231 and the second ring body 232 is changed, the elastic member 23 is able to undergo elastic deformation. The elastic member 23 is able to drive the first connecting member 112 and the second supporting member 22 move relatively, so that when the first connecting member 112 is disconnected from the second connecting member 13, the first connecting member 112 and the second supporting member 22 can both move into initial positions. When the first connecting member 112 and the second supporting member 22 are reset, the first axis L1, the second axis L2 and the third axis L3 coincide with each other.

Figure 9:
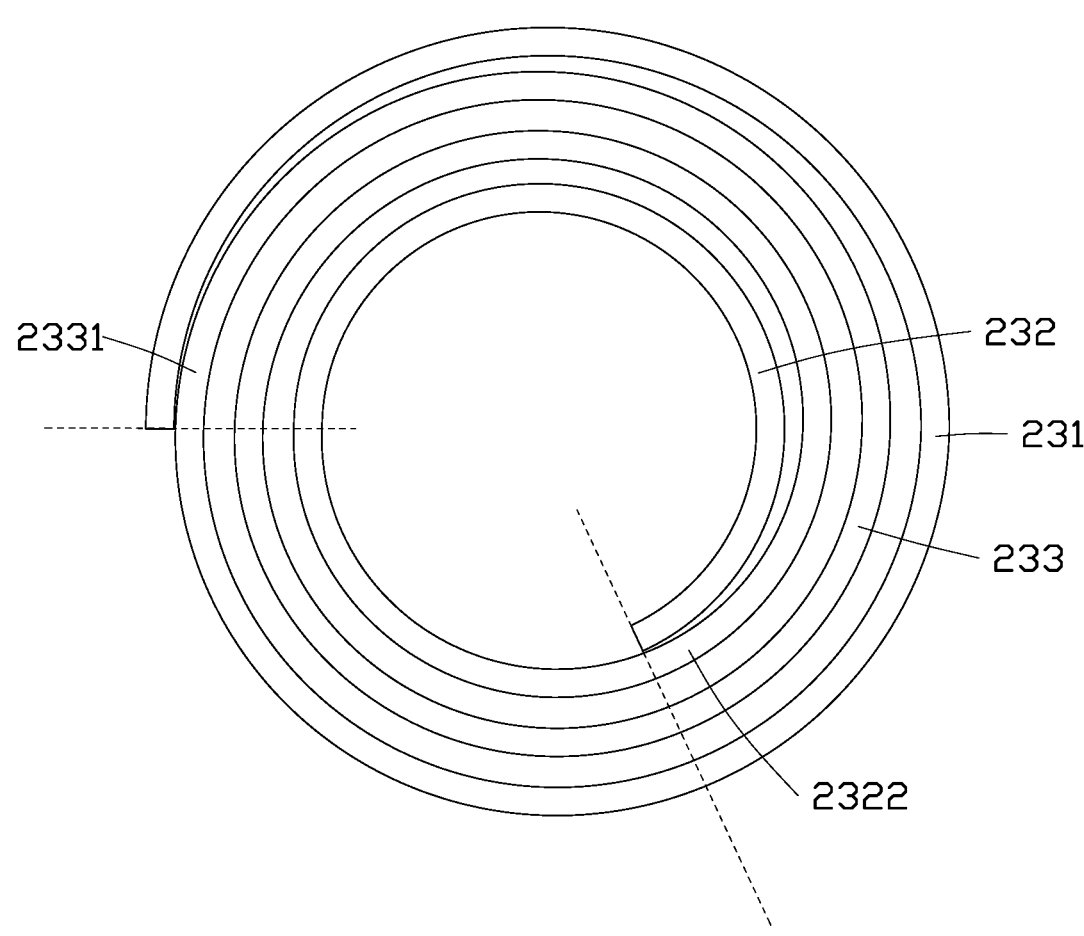
FIG. 9 is an isometric, assembled view of an elastic member in an embodiment of the present disclosure.

As shown in FIGS. 8 and 9, in some embodiments, the elastic member 23 further includes a third ring body 233. The third ring body 233 surrounds the second ring body 232. A gap is defined between the third ring body 233 and the second ring body 232. The third ring body 233 is located on a side of the first ring body 231 facing the second ring body 232. A gap is defined between the first ring body 231 and the third ring body 233. The third ring body 233 has a first end 2331 and a second end 2332. The first end 2331 of the third ring body 233 is connected to the first ring body 231, and the second end 2332 of the third ring body 233 is connected to the second ring body 232. The positions of the first end 2331 and the second end 2332 are as shown in FIG. 9.

Figure 10:
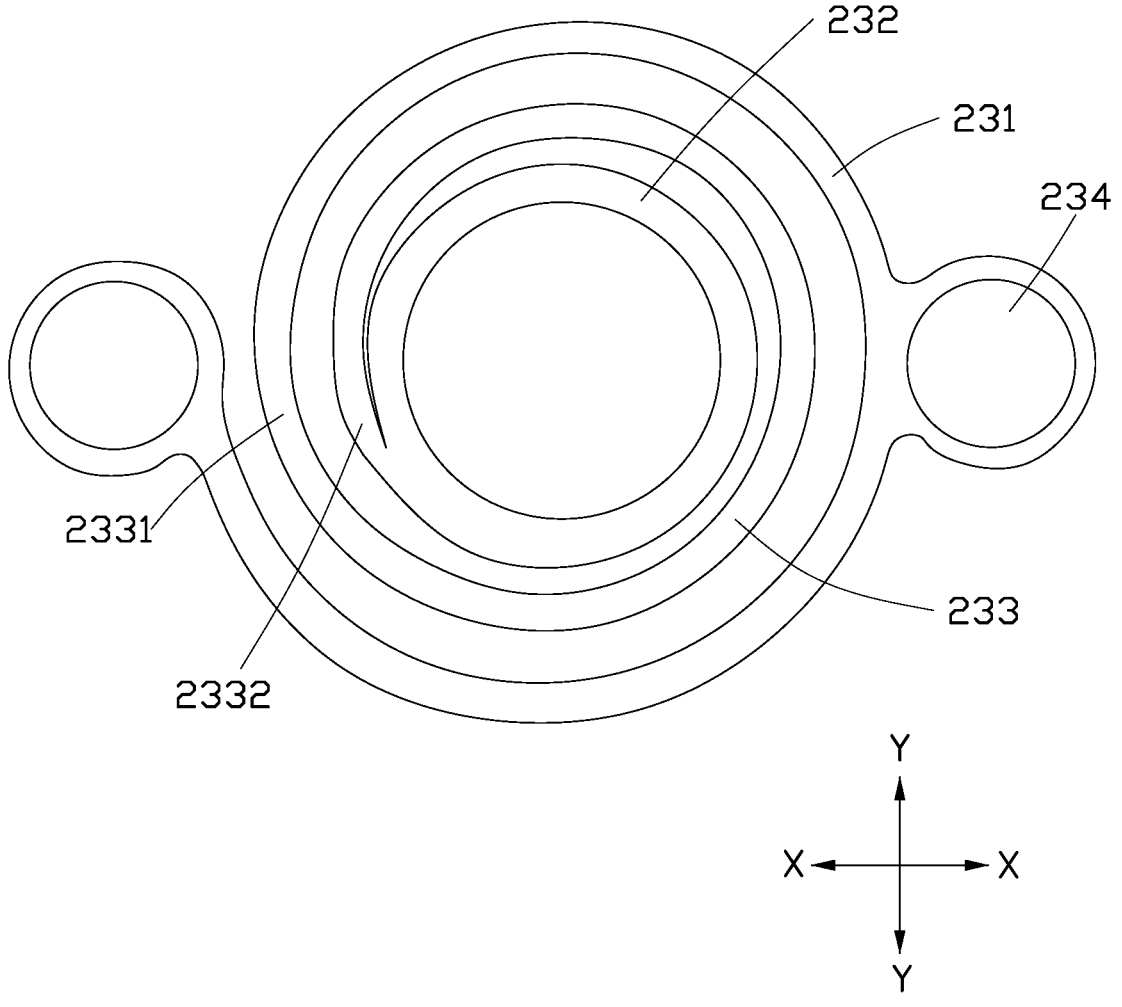
FIG. 10 is an isometric, assembled view of an elastic member in another embodiment of the present disclosure.

As shown in FIG. 10, in some embodiments, the second ring body 232 is in a closed ring shape, and the second end 2332 is connected to a side of the second ring body 232 facing the first ring body 231.

When the first connecting member 112 is moved and/or deflected relative to the first supporting member 21, the gap between the second ring body 232 and the third ring body 233 decreases, the gap between the first ring body 231 and the third ring body 233 also decreases, and the elastic member 23 undergoes a deformation. When the first ring body 231, the second ring body 232, and the third ring body 233 are released, the elastic member 23 drives the first connecting member 112 to an initial position.

In some embodiments, the extension length of the third ring body 233 is greater than the extension length of the second ring body 232, so that the third ring body 233 surrounds the second ring body 232 at least one round. The longer the extension length of the third loop body 233 is, the smaller the overall degree of deformation of the elastic member 23 will be, which will be conducive to reducing the plastic deformation of the elastic member 23.

Figure 11:
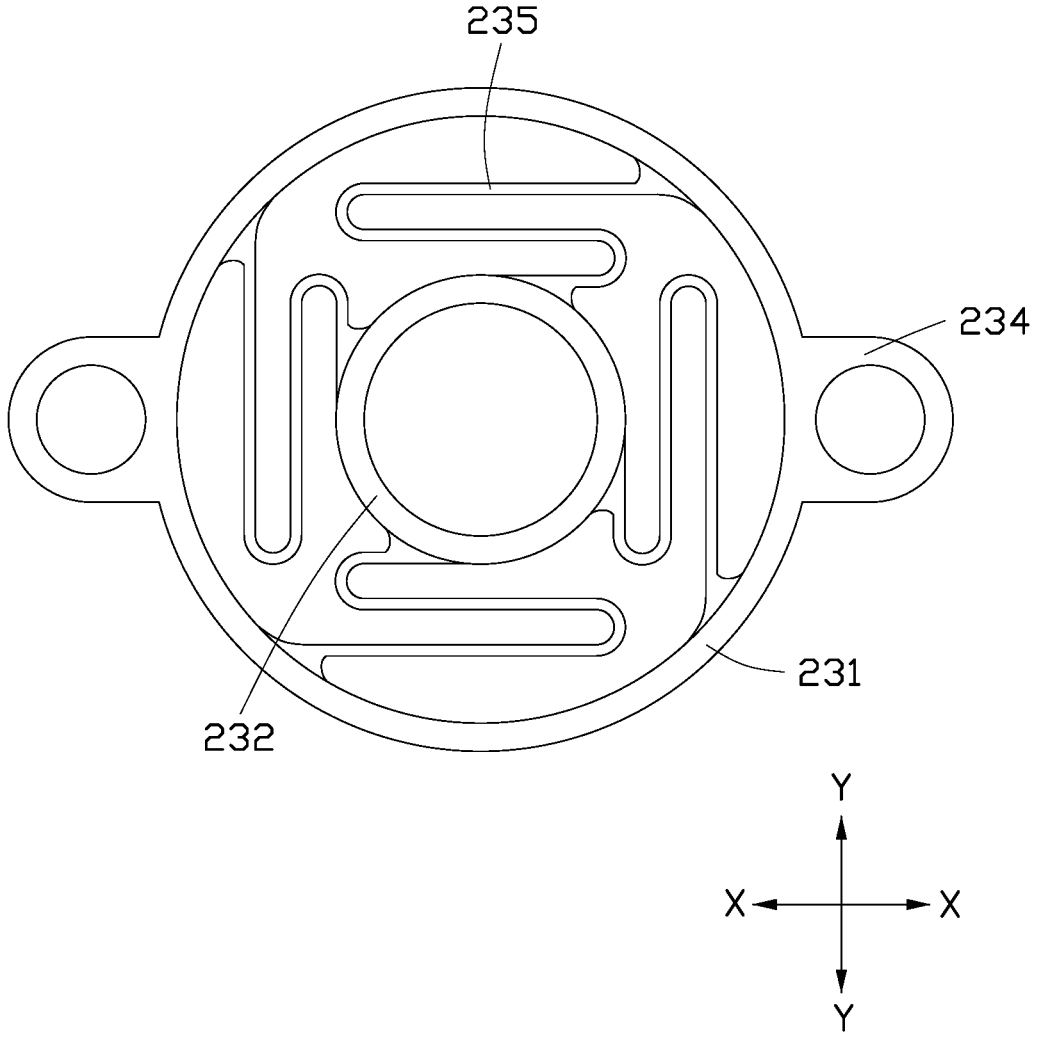
FIG. 11 is an isometric, assembled view of an elastic member in another embodiment of the present disclosure.

As shown in FIG. 11, in some embodiments, the elastic member 23 further includes a connecting portion 235. The connecting portion 235 is connected to the first ring body 231 and the second ring body 232. The connecting portion 235 can be produced by a component with elastic deformation capability such as rubber or spring steel.

As shown in FIG. 11, in some embodiments, the connecting portions 235 are provided in a plurality, the plurality of connecting portions 235 are disposed around an outer surface of the second ring body 232. Each of the plurality of connecting portions connecting portions 235 is able to generate an elastic deformation. When the second supporting member 22 is moved and/or deflected relative to the first supporting member 21, at least one of the connecting portions 235 acts on the second ring body 232 for driving the first connecting member 112. When the second supporting member 22 moves, the at least one of the connecting portions 235 is capable of elastically deforming so as to enable the second ring body 232 to move and/or deflect with respect to the first supporting member 21, and the connecting portions 235 deforms to generate an elastic force for driving the second ring body 232.

As shown in FIG. 11, in some embodiments, the number of the connecting portions 235 are four. The four connecting portions are disposed between the first ring body 231 and the second ring body 232. When the second supporting member 22 moves in the first direction X, the connecting portions 235 located in the first direction X are capable of elastic deformation; when the second supporting member 22 moves in the second direction Y, the connecting portions 235 located in the second direction Y are capable of elastic deformation.

As shown in FIGS. 10 and 11, in one embodiment, the elastic member 23 includes a mounting portion 234, the mounting portion 234 is disposed on an outer side of the first ring body 231, the mounting portion 234 is connected to the first supporting member 21, and the mounting portion 234 is disposed on an outer side of the mounting slot 211. The elastic member 23 can be mounted on the first supporting member 21 by the mounting portion 234 to improve the mounting stability of the elastic member 23, so that when the elastic member 23 deforms, the first ring body 231, the second ring body 232, and the connecting portions 235 are not easy to be detached from the mounting slot 211. In addition, the mounting portion 234 is mounted on the outside of the mounting groove 211, which is conducive to separating the elastic member 23 as a whole from the first supporting member 21 by the mounting portion 234, and reduces the situation in which the first loop body 231, the second ring body 232, and the connecting portions 235 cannot be removed from the mounting groove 211.

In some embodiments, the mounting portion 234 is removably connected to the support portion 214. The mounting portion 234 can be removably connected to the support portion 214 by means of bolts or rivets.

As shown in FIGS. 10 and 11, the number of the mounting portions 234 are two. The two mounting portions 234 are symmetrically distributed on both sides of the first ring body 231 for improving the force balance of the first ring body 231.

In some embodiments, the first ring body 231 and the second ring body 232 are produced by bending and coiling a piece of spring steel. In some other embodiments, the first ring body 231 and the second ring body 232 can also be made of plastic material.

As shown in FIG. 9, in some embodiments, the first ring body 231, the second ring body 232 and the third ring body 233 are formed by bending and coiling a piece of spring steel for improving the mechanical properties and dimensional stability of the elastic member 23.

In some embodiments, the first ring body 231, the second ring body 232 and the connecting part 235 are made of plastic material and are integrally formed for reducing the manufacturing difficulty of the elastic member 23.

As shown in FIG. 8, in some embodiments, along the axial direction of the first supporting member 21, the elastic member 23 has a first side 2321 and a second side 2322 opposite to each other. The first side 2321 of the elastic member 23 acts on the first connecting member 112. The second side 2322 of the elastic member 23 acts on the second supporting member 22.

In some embodiments, the first side 2321 is the side of the second ring body 232 facing away from the second supporting member 22, and the second side 2322 is the side of the second ring body 232 facing the second supporting member 22.

The elastic member 23 is clamped between the first connecting member 112 and the second supporting member 22. When the first connecting member 112 deflects relative to the second supporting member 22, the first side 2321 moves relative to the second side 2322.

In some embodiments, the first connecting member 112 is a plug, and the second connecting member 13 is a socket. The plug is configured to plug into the connecting base 200 for accommodating the accumulated tolerance of the plug and the socket, so that the plug and the socket can be precisely aligned.

The connector 200 in this application can also be applied to other equipment, such as for the docking of pipelines, the docking of power supplies and plugs.

When the first connecting member 112 and the second connecting member 13 cannot be precisely aligned due to accumulated tolerance, the second supporting member 22 is able to move and deflect in the installation slot 211, so that the first connecting member 112 is able to move and deflect to a position for aligning with the second connecting member 13. When the second supporting member 22 and the first connecting member 112 move, the elastic member 23 generates elastic deformation to act on the first connecting member 112. When the second connecting member 13 is disconnected, the elastic member 23 forces the first connecting member 112 and the second supporting member 22 to move relatively.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including, the full extent established by the broad general meaning of the terms used in the claims.

What is claimed is:

1. A connector configured for connecting to a first connecting member, the connector comprising:
   a first supporting member, a mounting hole defined on the first supporting member,
   a second supporting member partially and movably disposed in the mounting hole to be connected to the first supporting member, the second supporting member is deflectable axially relative to the first supporting member, the second supporting member is further movable relative to the first supporting member along a first direction perpendicular to an axial direction of the first supporting member; and
   an elastic member comprises a first ring body and a second ring body, wherein the first ring body is elastically connected with the second ring body, a first gap is defined between the first ring body and the second ring body, the first gap is configured for facilitating the first ring body moving or deflecting relative to the second ring body, one side of the first ring body facing away from the second ring body acts on the first supporting member through the mounting hole, the second ring body acts on an outside of the first connecting member, wherein
   when the second supporting member moves and/or deflects relative to the first supporting member, the first ring body and the second ring body correspondingly move and/or deflect relative to each other;
   wherein the elastic member further comprises a third ring body, the third ring body surrounds the second ring body, a second gap is defined between the second ring body and the third ring body, a third gap is defined between the third ring body and the first ring body, the third ring body comprises a first end and a second end, the first end of the third ring body is connected to the first ring body, and the second end of the third ring body is connected to the second ring body;
   the second ring body is in a closed ring shape;

the elastic member further comprises two mounting portions, the two mounting portions are symmetrically distributed on respective sides of the first ring body, the two mounting portions are connected to the first supporting member, and the two mounting portions are located outside the mounting hole.

2. The connector of claim 1, wherein the first supporting member comprises a body portion and a support portion, the mounting hole is defined on the body portion, the support portion is connected to the body portion, and located outside the mounting hole.

3. A server comprising:

a chassis, a first connecting member, and a connector comprising:

a first supporting member, a mounting hole is defined on the first supporting member, a second supporting member at least partially movably disposed in the mounting hole for connecting the first supporting member, the second supporting member is configured to be able to deflect axially relative to the first supporting member, the second supporting member is also configured to be able to translate relative to the first supporting member along a first direction perpendicular to an axial direction of the first supporting member, an elastic member comprises a first ring body and a second ring body, the first ring body is elastically connected with the second ring body, a gap is defined between the first ring body and the second ring body for translating or deflecting the first ring body relative to the second ring body, one side of the first ring body facing away from the second ring body acts on the first supporting member through the mounting hole, the second ring body acts on the outside of the first connecting member, when the second supporting member moves and/or deflects relative to the first supporting member, the first ring body and the second ring body are forced to translate and/or deflect relative to each other, the first supporting member is connected to the chassis along an axial direction of the second supporting member;

wherein the elastic member further comprises a third ring body, the third ring body surrounds the second ring body, a second gap is defined between the second ring body and the third ring body, a third gap is defined between the third ring body and the first ring body, the third ring body comprises a first end and a second end, the first end of the third ring body is connected to the first ring body, and the second end of the third ring body is connected to the second ring body;

the second ring body is in a closed ring shape;

the elastic member further comprises two mounting portions, the two mounting portions are symmetrically distributed on respective sides of the first ring body, the two mounting portions are connected to the first supporting member, and the two mounting portions are located outside the mounting hole.

4. The server of claim 3, wherein along an axial direction of the first supporting member, the elastic member comprises a first side and a second side, the first side of the elastic member acts on the first connecting member, the second side of the elastic member acts on the second supporting member.

5. A computer, comprising:

a second connector, a server comprising:

a chassis, a first connecting member, and a connector comprising:

a first supporting member, a mounting hole is defined on the first supporting member, a second supporting member at least partially and movably disposed in the mounting hole for connecting to be connected to the first supporting member, the second supporting member is configured to be able to deflectable axially relative to the first supporting member, the second supporting member is also further configured to be able to translate movable relative to the first supporting member along a first direction perpendicular to an axial direction of the first supporting member; and an elastic member comprises a first ring body and a second ring body, wherein the first ring body is elastically connected with the second ring body, a first gap is defined between the first ring body and the second ring body, the first gap is configured for facilitating translating or deflecting the first ring body moving or deflecting relative to the second ring body, one side of the first ring body facing away from the second ring body acts on the first supporting member through the mounting hole, the second ring body acts on the an outside of the first connecting member, wherein when the second supporting member moves and/or deflects relative to the first supporting member, the first ring body and the second ring body are forced to translate correspondingly move and/or deflect relative to each other;

the first supporting member is connected to the chassis along an axial direction of the second supporting member;

the second connector is provided on a rack, and the second connector is connected to the connector;

wherein the elastic member further comprises a third ring body, the third ring body surrounds the second ring body, a second gap is defined between the second ring body and the third ring body, a third gap is defined between the third ring body and the first ring body, the third ring body comprises a first end and a second end, the first end of the third ring body is connected to the first ring body, and the second end of the third ring body is connected to the second ring body;

the second ring body is in a closed ring shape;

the elastic member further comprises two mounting portions, the two mounting portions are symmetrically distributed on respective sides of the first ring body, the two mounting portions are connected to the first supporting member, and the two mounting portions are located outside the mounting hole.

\* \* \* \* \*